(12) United States Patent
Belitzer et al.

(10) Patent No.: US 7,733,184 B2
(45) Date of Patent: Jun. 8, 2010

(54) CIRCUIT ARRANGEMENT AND METHOD FOR POWER REGULATION AND AMPLIFIER ARRANGEMENT

(75) Inventors: Alexander Belitzer, Munich (DE);
Michael Feltgen, Krefeld (DE);
Giuseppe Li Puma, Zechenstr (DE);
Christian Vieth, Neukirchen-Vluyn (DE)

(73) Assignee: Infineon Technologies AG, Neubiberg (DE)

( * ) Notice: Subject to any disclaimer, the term of this patent is extended or adjusted under 35 U.S.C. 154(b) by 69 days.

(21) Appl. No.: 12/234,387

(22) Filed: Sep. 19, 2008

(65) Prior Publication Data

US 2009/0079504 A1    Mar. 26, 2009

(51) Int. Cl.
*H03G 3/10* (2006.01)
(52) U.S. Cl. ...................................... 330/279; 330/278
(58) Field of Classification Search ................. 330/279, 330/278, 290, 296, 285
See application file for complete search history.

(56) References Cited

U.S. PATENT DOCUMENTS

| 6,014,217 A * | 1/2000 | Sanders et al. ............... 356/461 |
| 6,018,552 A * | 1/2000 | Uesugi ....................... 375/330 |
| 7,212,640 B2 * | 5/2007 | Bizjak ......................... 381/106 |
| 7,469,491 B2 * | 12/2008 | McCallister et al. ........ 375/296 |

* cited by examiner

*Primary Examiner*—Henry K Choe
(74) *Attorney, Agent, or Firm*—Lee & Hayes, PLLC

(57) ABSTRACT

A circuit arrangement and method for power regulation and an amplifier arrangement for power regulation are described.

31 Claims, 3 Drawing Sheets

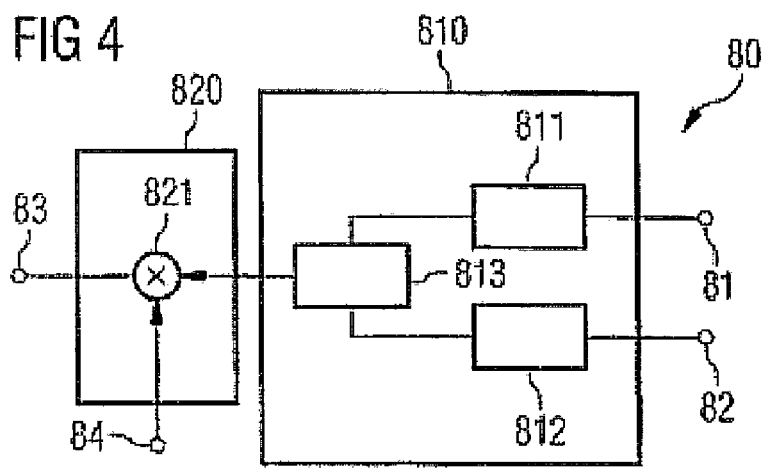
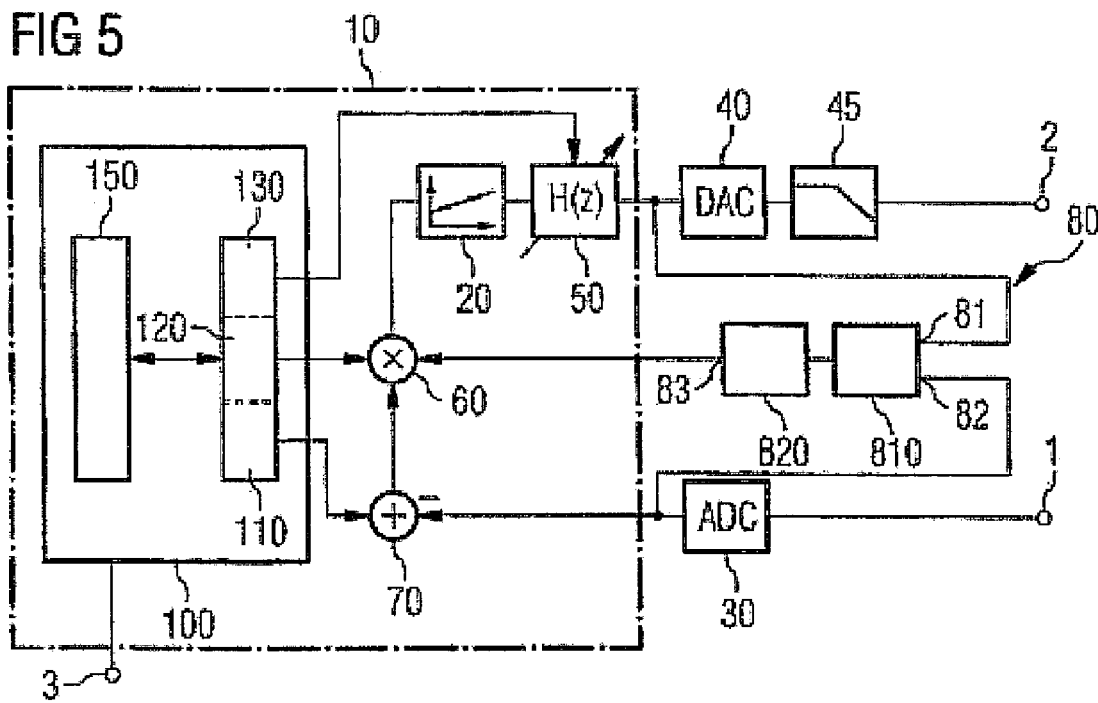
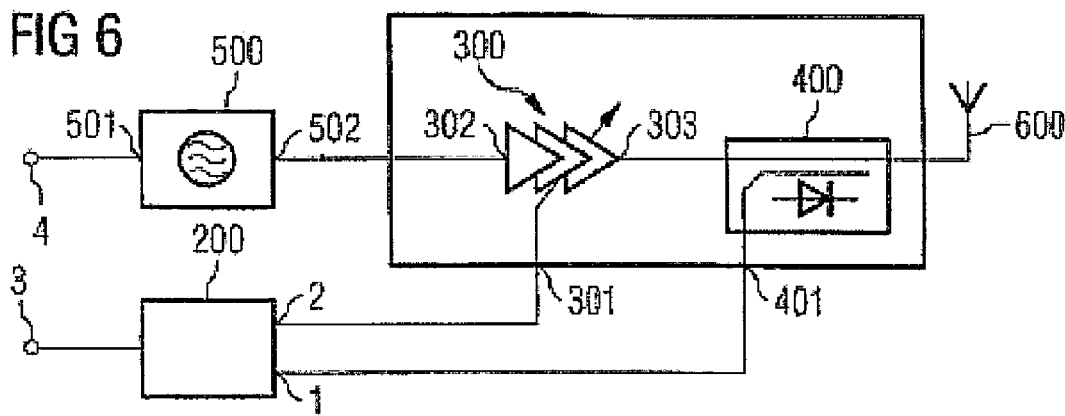

CIRCUIT ARRANGEMENT AND METHOD FOR POWER REGULATION AND AMPLIFIER ARRANGEMENT

FIELD OF THE DISCLOSURE

The disclosure relates to a circuit arrangement and a method for power regulation and also an amplifier arrangement comprising the circuit arrangement.

BACKGROUND

Many mobile transmission systems use power amplifiers for amplifying radio-frequency signals to be emitted. In this case, depending on various external and internal influencing variables it may be necessary to control the output power of the amplifier used. By way of example, an output power of the amplifier is measured and a corresponding controlled variable of the amplifier is adapted in a manner dependant on the output power.

Furthermore, it may be expedient to operate such power amplifiers in such a way that they have a high efficiency with regard to the required and emitted power. However, this can be problematic in particular for small and medium output powers. By way of example, an internal bias current regulation that reduces the bias current of the amplifier for low input powers is provided for this purpose in some power amplifiers.

However, for a predetermined external regulation with regard to the output power which results for example from a power characteristic of a mobile radio standard such as the Global System for Mobile Communication (GSM) standard, such an internal bias current regulating circuit of the amplifier can influence the regulating parameters of the external power regulation. Under certain circumstances, this can lead to the contravention of a predetermined power mask or even to instability of the power regulating circuit.

SUMMARY

In one exemplary embodiment of a circuit arrangement for power regulation, said circuit arrangement comprises a signal input for feeding in a level value, a signal output for outputting a control value, and a control input for feeding in a power control word. Furthermore, a compensation device is provided, which is coupled to the signal input, the signal output and the control input and is designed to derive the control value from the level value depending on the power control word. In this case, the deriving comprises determining a deviation of the level value from a desired value, which is dependent on the power control word, and a multiplication by a compensation factor, which is likewise dependent on the power control word.

The power control word predetermines for the circuit arrangement a value which corresponds to a desired gain or to a desired power of an amplifier connected to the signal input and the signal output. The level value represents the power instantaneously output at the amplifier, while the control value can be output as a variable for setting a gain or a power of the amplifier. In the compensation device the desired value is determined as a function of the power control word, wherein, in the steady-state condition of the regulating circuit formed by the circuit arrangement with the amplifier, the level value fed in should correspond to the desired value. To put it another way, the deviation between level value and desired value should tend towards zero.

Furthermore, in the compensation device, a compensation factor is determined as a function of the power control word, said compensation factor being multiplied for example by the deviation determined. In this case, the compensation factor is determined in such a way that it is possible to compensate for variations of the regulating parameters depending on the power predetermined by the power control word. The deviation multiplied by the compensation factor can be output with or without further processing as control value at the signal output.

As a result of the weighting of the deviation determined, which can also be referred to as regulation deviation, with the compensation factor that is determined in a manner adapted in power-dependent fashion, it is possible to enable an amplifier to be precisely regulated even in the case of a varying amplifier characteristic.

BRIEF DESCRIPTION OF THE DRAWINGS

A plurality of exemplary embodiments are explained in more detail below in the detailed description with reference to the figures. In this case, elements that are identical in terms of function or action bear the same reference symbols.

FIG. 4 shows an exemplary embodiment of a correction device.

FIG. 5 shows a fourth exemplary embodiment of a circuit arrangement for power regulation.

FIG. 6 shows an exemplary embodiment of a radio-frequency transmission system.

DETAILED DESCRIPTION

Figure 1:
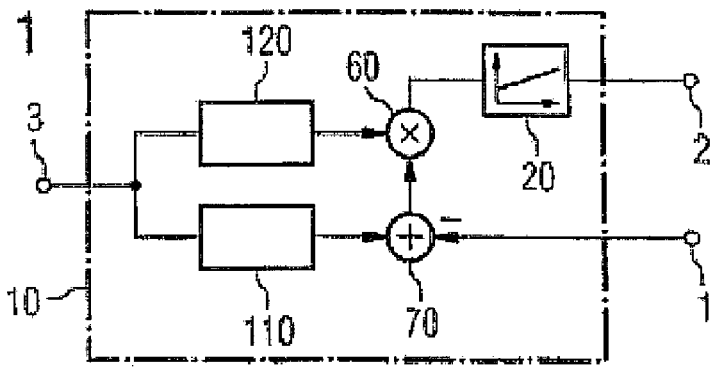
FIG. 1 shows a first exemplary embodiment of a circuit arrangement for power regulation.

Further aspects and embodiments are provided in the following description. In addition, reference is made to the accompanying figures, which form part of the description and which show by means of illustrations how features of the disclosure can be embodied in practice. The embodiments of the drawings are provided to enable a better understanding of one or more aspects of the disclosure. The embodiments of the drawings are not intended to restrict the features or key elements of the disclosure to a specific embodiment. Rather, the various elements, aspects and features which are disclosed in the exemplary embodiments can be combined in various ways by a person skilled in the art in order to achieve one or more advantages of the disclosure. It should be understood that other embodiments could be used and that structural or logical alterations could be made without departing from the central concept of the disclosure. The elements in the drawings are not necessarily scaled in a manner true to scale with respect to one another.

The disclosure describes a circuit arrangement and a method for power regulation which enable a precise regulation of an amplifier even in the case of a varying amplifier characteristic. The disclosure also describes an amplifier arrangement comprising such a circuit arrangement.

FIG. 1 shows an exemplary embodiment of a circuit arrangement for power regulation, which circuit arrangement comprises a signal input 1, a signal output 2 and a control input 3 and a compensation device 10. The compensation device 10 has a difference unit 70, which is coupled, on the input side, to a first parameter unit 110 and to the signal input 1. Furthermore, the compensation device 10 has a multiplication unit 60, which is coupled, on the input side, to an output of the difference unit 70 and also to a second parameter unit 120. An output of the multiplication unit 60 is coupled via an integration filter 20 to the signal output 2 of the circuit arrangement. The first and the second parameter unit 110, 120 each have a terminal coupled to the control input 3.

Via the control input 3, a power control word can be fed to the circuit arrangement or to the first and second parameter units 110, 120, said power control word corresponding for example to a desired output power of an amplifier connected to the signal input 1 and the signal output 2, said amplifier not being illustrated here for reasons of clarity. In the first parameter unit 110, a desired value for a power level is determined as a function of the power control word and passed to the difference unit 70. In the difference unit 70, a deviation of a level value, which is fed in for example from an amplifier at the signal input 1, from the desired value is determined and passed to the multiplication unit 60 for further processing.

A compensation factor is determined depending on the power control word in the second parameter unit 120, said compensation factor taking account for example of variations of an amplifier characteristic of the amplifier in a manner dependent on a respective output power. Said compensation factor is combined multiplicatively with the previously determined deviation in the multiplication unit 60. The result of the multiplication is passed to the integration filter 20 in order to derive a control value, which is passed via the signal output 2 for example to a setting input of the amplifier.

The control value is thus derived by determining a deviation of the level value from the desired value, by multiplication by the compensation factor and via the integration filter 20. An order of the integration filter 20 and the multiplication device 60 in the series circuit comprising multiplication device 60 and integration filter 20 can be interchanged as desired.

The desired value and compensation factor are determined in the parameter units 110, 120 for example in such a way that both the transfer properties and the regulation properties of a connected amplifier are taken into account in the parameters determined. The amplifier has an internal bias current regulation, for example, which alters the regulating parameters of the power regulating circuit for different powers. By way of example, it may be expedient for the properties of the connected amplifier to be known at the outset and to be available for instance as an analytical function or as a value table in the parameter units 110, 120. Consequently the regulation behavior of the circuit arrangement can be individually adapted to a connected amplifier or amplifier to be connected, in order to enable a precise regulation in each case.

Figure 2:
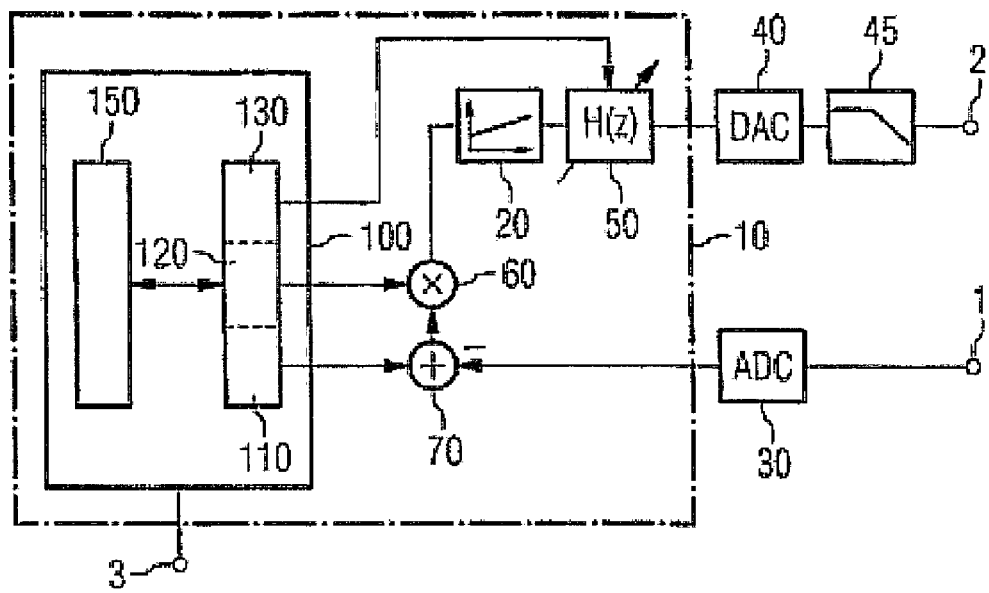
FIG. 2 shows a second exemplary embodiment of a circuit arrangement for power regulation.

FIG. 2 shows a further exemplary embodiment of a circuit arrangement for power regulation. As supplementation to the elements illustrated in FIG. 1, the circuit arrangement in this exemplary embodiment additionally comprises an analogue-to-digital converter 30, which couples the signal input 1 to the compensation circuit 10 or the difference unit 70. Moreover a digital-to-analogue converter 40 with low-pass filter 45 connected downstream are provided, which couple the compensation device 10 to the signal output 2. The compensation device 10 comprises, alongside the difference unit 70 and the multiplication unit 60, a compensation filter 50, which is connected downstream of the integration filter 20. A circuit section 100 comprises the first, the second and a third parameter unit 110, 120, 130 and also a memory device 150 coupled to the parameter units 110, 120, 130. The third parameter unit 130 is connected to a setting input of the compensation filter 50.

In this exemplary embodiment, the level value is fed in from a connected amplifier as an analogue signal and is converted into a digital level value by means of the analogue-to-digital converter 30. The digital level value determined in this way is thus processed by means of digital processing in the compensation device 10. Accordingly, an analogue control value can be determined from the digitally derived control value by means of the digital-to-analogue converter 40, said analogue control value passed as control signal to the connected amplifier. For the case where a connected amplifier already comprises digital interfaces for outputting a digital level value or for receiving a digital control value, the analogue-to-digital converter 30 and/or digital-to-analogue converter 40 can also be dispensed with in further exemplary embodiments.

Effects of bandwidth variations of the connected amplifier or the transfer characteristic thereof can be compensated for by the compensation filter 50. In this case, the filter coefficients of the transfer function $H(z)$ of the compensation filter 50 are provided individually by the third parameter unit 130, wherein these are determined depending on the power control word at the control input 3. Consequently, the deriving of the control value at the output of the compensation device 10 is additionally effected via the compensation filter 50.

The memory device 150 is provided for determining the respective parameters of the parameter units 110, 120, 130. In particular, respective desired values, respective compensation factors and respective filter coefficients can be stored and retrieved in the memory device 150 depending on a respective power control word. During operation of the circuit arrangement, therefore, a power control word can be fed in via the control input 3, the parameter units 110, 120, 130 determining the respective parameters depending on said power control word, for example with the aid of parameters stored in the memory device 150. In this case, it is not necessary for a dedicated set of parameters to be stored in the memory device 150 for every possible value of the power control word. It may also suffice if sets of parameters are stored for specific values of the power control word and corresponding compensation factors and/or filter coefficients of the compensation filter 50 are determined for intermediate values of the power control word by interpolation of values stored in the memory device 150.

The digital compensation filter 50 can therefore be adapted, with regard to its transfer function $H(z)$, dynamically to a bandwidth variation of the connected amplifier. The compensation filter 50 therefore represents a temporally variable digital filter whose coefficients can be varied in a manner dependent on a desired gain.

The multiplication unit 60, the integration filter 20 and the compensation filter 50 in turn form a series circuit for the processing of the deviation determined by means of the difference unit 70 for deriving the control value. An order of the elements 60, 20, 50 within the series circuit can also be interchanged as desired in other embodiments since linear functions are involved in each case. However, an interchanged order could also be taken into account for non-linear functions in the parameterization of the circuit arrangement.

Figure 3:
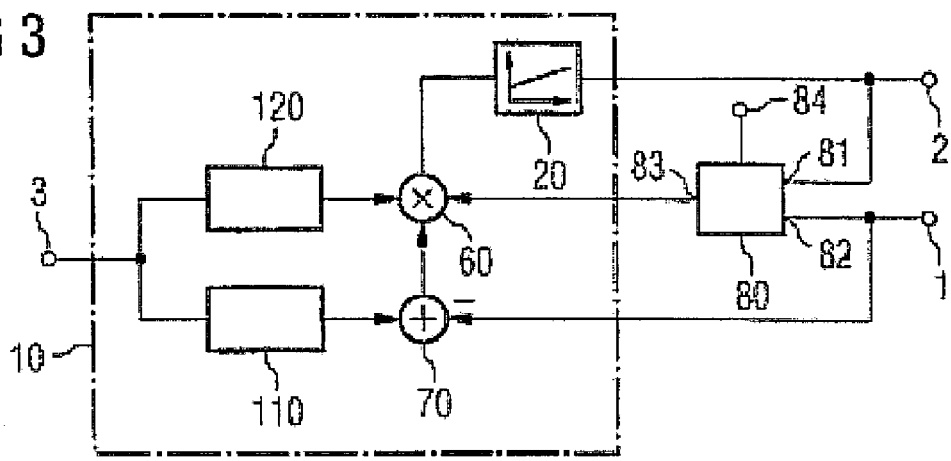
FIG. 3 shows a third exemplary embodiment of a circuit arrangement for power regulation.

FIG. 3 shows a further exemplary embodiment of a circuit arrangement for power regulation. In this case, in addition to the elements illustrated in FIG. 1, the circuit arrangement comprises a correction device 80 having a first input 81, which is coupled to the signal output 2, a second input 82, which is coupled to the signal input 1, an output 83, which is connected to a further input of the multiplication unit 60, and also a control input 84.

Besides the elements and methods for deriving the control value that are already known from the exemplary embodiment from FIG. 1, a correction factor can be determined by the correction device 80 in a manner dependent on the level value and the control value, wherein the control value is additionally derived by multiplication by the correction factor. By way of example, by means of the correction device 80 it is possible to detect whether the level value output by the connected amplifier has a linear or logarithmic dependence on the respective output power of the amplifier. To put it another way, by means of the correction device 80 it is possible to ascertain whether a connected amplifier comprises a linear or a logarithmic detector. A scaling factor can also be fed to the correction device 80 via the control input 84, which scaling factor can be included in the calculation of the correction factor.

FIG. 4 shows an exemplary embodiment of a correction device 80 that can be used for example in the circuit arrangement from FIG. 3. In this case, the correction device 80 comprises a detector unit 810 and a control unit 820. The detector unit 810 has a first and a second processing element 811, 812, which are coupled, on the input side, to the inputs 81, 82 of the correction device 80. The detector unit 810 furthermore comprises a division element 813, which is coupled, on the input side to outputs of the processing elements 811, 812, and, on the output side, to a multiplication unit 821 that the control unit 820 comprises. A second input of the multiplication unit 821 is coupled to the control input 84, while an output of the multiplication unit 821 forms the output 83 of the correction device 80.

In the first processing element 811, present and past values of control values can be stored, preferably in digital form, in order to determine a variation or deviation of the level value. Accordingly, the second processing element 812 is designed to store present and past values of the level value in order to determine a variation or deviation of the level value.

By means of the division element 813 a differential gain factor can be determined by division of the determined deviation of the level value and the determined deviation of the control value. In this case, the differential gain factor essentially corresponds to the gain at the instantaneously set operating point of the connected amplifier. Particularly in the case of an amplifier with a logarithmic detector, said gain factor can vary greatly for different operating points. The gain factor determined in this way is adapted by the multiplication unit 821 by means of the scaling factor at the control input 84, which gives rise to the correction factor that is incorporated multiplicatively into the processing or deriving of the control value. With reference to FIG. 3, this is effected by means of the multiplication unit 60, wherein it is also possible to provide a separate multiplication unit for the correction factor upstream or downstream of the multiplication unit 60.

In order to reduce further the complexity required in a digital division, in a further exemplary embodiment, in the first processing element 811, it is also possible to detect a specific alteration of the level value, for example by two steps, by four steps or by a number of steps which corresponds to a power of two. This is because a division by a power of two can also be realized in a simplified manner by binary shift operations toward the right. By way of example, a shift by four digit positions toward the right in binary representation corresponds to a division by sixteen. In the second processing element 812, therefore, only a difference between different level values is determined, while the division in the division element 813 is realized by means of a corresponding shift operation.

The function of the correction device 80 can also be combined with the exemplary embodiment of the circuit arrangement from FIG. 2. This is illustrated by way of example in the exemplary embodiment in FIG. 5. In this case, the inputs 81, 82 of the correction device 80 are coupled to the terminals of the compensation device 10 in such a way that in each case digital values can be fed to the correction device 80. To put it another way, the correction device 80 is coupled to the input of a digital-to-analogue converter 40 and the output of the analogue-to-digital converter 30. In different embodiments, the scaling factor for the correction device 80 can also be provided by the compensation device 10 and depend for example on the power control word or the compensation factor. It is also possible to combine the compensation factor and the scaling factor for determining the correction factor, such that only a multiplication by a combined compensation and correction factor is necessary. For the rest, the function of the embodiment of the circuit arrangement that is illustrated in FIG. 5 corresponds to the exemplary embodiments described above.

FIG. 6 shows an exemplary embodiment of a transmission system comprising a frequency generating device 500 and an amplifier arrangement, said system preferably being suitable for the transmission of radio-frequency signals. The amplifier arrangement comprises an amplifier 300 having an amplifier input 302, which is coupled to an output 502 of the frequency generating device 500, an amplifier output 303 and a setting input 301. The amplifier arrangement furthermore comprises a detection device 400, which is coupled to the amplifier 300 and has a detector output 401 for outputting a level value of the amplifier 300, and also a circuit arrangement 200 according to any of the exemplary embodiments described above. In this case, the signal input 1 is coupled to the detector output 401 and the signal output 2 is coupled to the setting input 301. The frequency generating device 500 furthermore comprises a signal input 501, which is coupled to a data input 4 for feeding in transmission data to be transmitted. The amplifier 300 is additionally coupled, on the output side to an antenna 600 for emitting radio-frequency energy.

In the frequency generating device 500, a corresponding radio-frequency signal is generated for example depending on the data to be transmitted at the input 4, said signal comprising the data to be transmitted in coded form. The radio-frequency signal is amplified in terms of its power by means of the amplifier 300 and emitted via the antenna 600 The gain or the power to be output of the amplifier 300 can be set via the setting input 301. The power level that is output can be detected by means of the detection device 400, which for example is embodied as a directional coupler or comprises a diode-based detector unit. In this case, the detection device 400 can have a linear or logarithmic detector behavior for different types of amplifier. Independently of this, the detected level value is passed to the circuit arrangement 200 and is processed in the latter depending on a respective power control word at the control input 3 to form a control value for the amplifier 300.

The amplifier 300 preferably has a non-linear transfer characteristic curve since a satisfactory efficiency can be achieved with amplifiers of this type. The frequency generating device 500 outputs for example the radio-frequency signal with a constant amplitude. In one exemplary embodiment, the frequency generating device 500 generates the radio-frequency signal with data coded according to the GSM standard. The arrangement illustrated in FIG. 6 can be used for example in a mobile communication device such as a mobile telephone.

Figure 7:
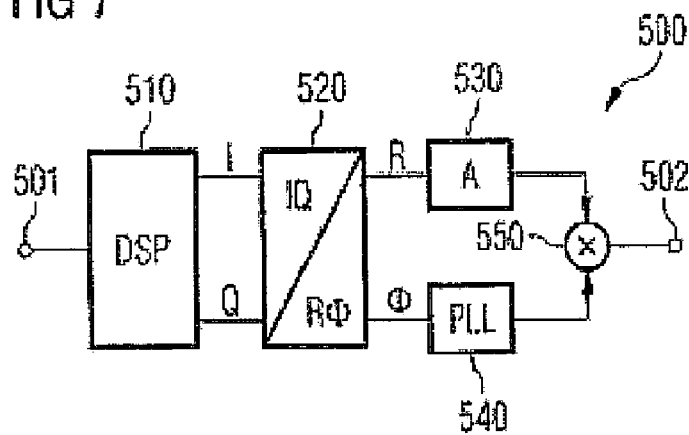
FIG. 7 shows an exemplary embodiment of a radio-frequency generating device.

FIG. 7 shows an exemplary embodiment of a frequency generating device 500. The latter comprises a digital signal processor, DSP 510, which is coupled to the input 501 on the input side and to a conversion device 520 on the output side. A first output of the conversion device 520 is coupled to an amplitude unit 530 and a second output is coupled to a phase locked loop 540. The outputs of the amplitude unit 530 and of the phase locked loop 540 are coupled to a mixing device 550, which, on the output side is connected to the output 502 of the frequency generating device 500.

Data to be transmitted are fed to the digital signal processor 510 via the input 501, said data being converted to form a complex signal having an in phase component I and a quadrature component Q. In the conversion unit 520, the complex signal I, Q is converted into a representation according to magnitude R and phase $\phi$. By way of example, the conversion unit 520 is embodied as co-ordinate rotation digital computer, CORDIC. The magnitude portion R is processed further in the amplitude unit 530, while the phase portion $\phi$ is used for a phase modulation in the phase locked loop S40. In the mixing device 550, the radio-frequency signal generated by the phase locked loop 540 is mixed with the processed amplitude portion and output as modulated radio-frequency signal at the output 502.

Figure 8:
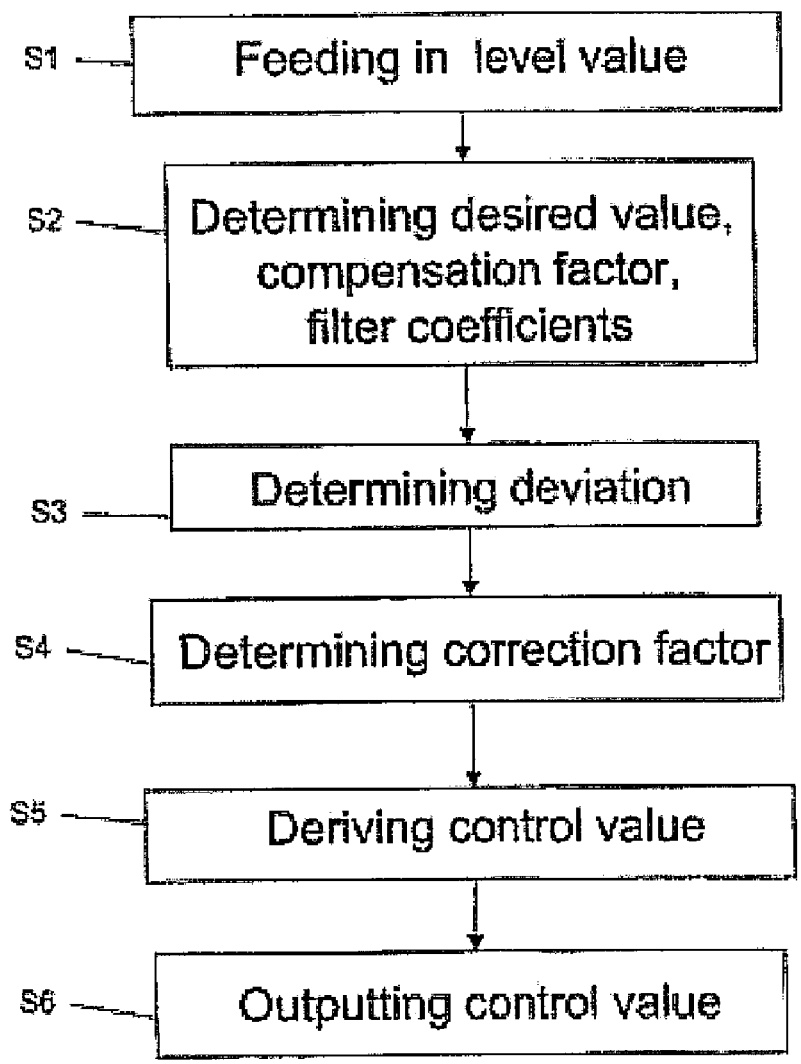
FIG. 8 shows an exemplary embodiment of a method for power control.

FIG. 8 shows an exemplary embodiment of a method for power regulation in the form of a flowchart. In S1, a regulating value is fed in from an amplifier, said value corresponding to a present power level of the amplifier.

In S2 a power control word corresponding to a desired power level of the amplifier is fed in. A desired value, a compensation factor and, in various embodiments, filter coefficients of a compensation filter are determined depending on the power control word. By way of example, the desired value, the compensation factor and the filter coefficients are read out from a value table in a manner dependent on the power control word. If a corresponding value is not stored in the value table for every possible value of the power control word, intermediate values can also be determined by interpolation from stored values. In further exemplary embodiments, the desired value, the compensation factor and the filter coefficients can also be determined completely or partly analytically in a manner dependent on the power control word.

In S3, a deviation between the desired value determined and the level value fed is determined. The deviation determined represents a regulation deviation of the connected amplifier.

In S4, a correction factor can additionally be derived in a manner dependent on the level value fed in and a control value already determined previously. For this purpose, in one embodiment of the method, a differential gain factor is determined from the level value and the control value, in particular by division of the deviation of the level value and a deviation of the control value. In this case, the differential gain factor represents a gain at an instantaneous operating point of the amplifier to be controlled. The differential gain factor can additionally be weighted with a scaling factor in order to obtain the correction factor therefrom.

In S5 a control value is derived from the deviation determined. In this case, the deriving is effected by multiplication by the compensation factor determined previously, a multiplication by the correction factor, a filtering with the determined filter coefficients in a compensation filter function and an integrating filtering. In different embodiments, it is also possible to omit individual processes when deriving the control value.

In S6, the control value determined previously is output to the amplifier.

Different embodiments can comprise an analogue-to-digital conversion when feeding in the level value, such that the level value is processed in digital form. In this case, inter alia, the control value determined is also present as a digital value which, depending on the constitution of a respective control input of the amplifier to be controlled, is output to the amplifier in digital form or, after digital-to-analogue conversion, in analogue form.

The method described thus enables a precise power regulation of an amplifier even in the case of varying amplifier characteristic.

The invention claimed is:

1. A circuit arrangement comprising:
   a signal input to feed in a level value;
   a signal output to output a control value;
   a control input to feed in a power control word; and
   a compensation device coupled to the signal input, the signal output and the control input, the compensation device configured to derive the control value from the level value depending on the power control word;
   wherein the deriving comprises determining a deviation of the level value from a desired value, which is dependent on the power control word, and multiplication of the deviation of the level value by a compensation factor, which is dependent on the power control word.

2. The circuit arrangement of claim 1, wherein the compensation device comprises an integration filter and is configured to derive the control value via the integration filter.

3. The circuit arrangement of claim 1, wherein the compensation device is coupled to the signal input via an analogue-to-digital converter, and wherein the analogue-to-digital converter is configured to determine a digital level value and is configured to derive the control value from the digital level value via digital signal processing.

4. The circuit arrangement of claim 3, wherein the compensation device is coupled to the signal output via a digital-to-analogue converter configured to derive the control value from a digitally derived control value.

5. The circuit arrangement of claim 1, wherein the compensation device comprises a compensation filter and the compensation device is configured to derive the control value via the compensation filter and to determine filter coefficients of the compensation filter depending on the power control word.

6. The circuit arrangement of claim 5, wherein the compensation device comprises a memory device configured to store and retrieve at least one of respective desired values, respective compensation factors, and respective filter coefficients, depending on a respective power control word.

7. The circuit arrangement of claim 6, wherein the compensation device is configured to determine at least one of compensation factors and filter coefficients of the compensation filter by interpolation of values stored in the memory device.

8. The circuit arrangement of claim 1, further comprising a correction device, the correction device configured to determine a correction factor depending on the level value and the control value and to derive the control value by multiplication by the correction factor.

9. The circuit arrangement of claim 8, wherein the correction device is configured to determine a differential gain factor from the level value and the control value and to derive the correction factor from the differential gain factor when determining the correction factor.

10. The circuit arrangement of claim 9, wherein the correction device is configured to determine the differential gain factor by division of the deviation of the level value and a deviation of the control value.

11. The circuit arrangement of claim 9, wherein the correction device is configured to derive the correction factor from the differential gain factor by multiplication by a scaling factor.

12. The circuit arrangement of claim 1, wherein the signal input is coupled to a detector output of a detection device coupled to an amplifier, the detector output to output a level value of the amplifier, and wherein the signal output is coupled to a setting input of the amplifier.

13. The circuit arrangement of claim 1, wherein the circuit arrangement is included in a mobile communications device.

14. A circuit arrangement comprising:
   a signal input to feed in a level value;
   a signal output to output a control value;
   a control input to feed in a power control word; and
   a compensation device including:
      a first parameter unit to derive a desired value depending on the power control word;
      a second parameter unit to derive a compensation factor in depending on the power control word;
      a difference unit, and
      a series circuit formed by a multiplication unit and an integration filter, the series circuit coupled, on an output side, to the signal output, and an input of the multiplication unit is coupled to the second parameter unit;
   wherein the difference unit comprises a first input coupled to the first parameter unit, a second input coupled to the signal input, and an output coupled to the series circuit.

15. The circuit arrangement of claim 14, wherein the series circuit comprises a compensation filter and the compensation device comprises a third parameter unit to derive filter coefficients of the compensation filter depending on the power control word.

16. The circuit arrangement of claim 14, wherein the difference unit is coupled to the signal input via an analogue-to-digital converter, the series circuit is coupled to the signal output via a digital-to-analogue converter, or a combination thereof.

17. The circuit arrangement of claim 14, further comprising a correction device to determine a correction factor, wherein the correction device is coupled, on an input side, to the signal input and the signal output and, on an output side, to the multiplication unit.

18. The circuit arrangement of claim 17, wherein the correction device is configured to determine a differential gain factor by division of a deviation of the level value and a deviation of the control value and to derive the correction factor from the differential gain factor by multiplication by a scaling factor.

19. The circuit arrangement of claim 14, wherein the signal input is coupled to a detector output of a detection device coupled to an amplifier, the detector output to output a level value of the amplifier, and wherein the signal output is coupled to a setting input of the amplifier.

20. A method comprising:
   feeding in a level value from an amplifier;
   determining a desired value depending on a power control word;
   determining a deviation of the level value from the desired value;
   determining a compensation factor depending on the power control word;
   deriving a control value depending on the deviation of the level value from the desired value, wherein deriving the control value comprises a multiplication by the compensation factor; and
   outputting the control value to the amplifier.

21. The method of claim 20, wherein deriving the control value comprises an integrated filtering.

22. The method of claim 20, wherein feeding in the level value comprises an analogue-to-digital conversion.

23. The method of claim 20, wherein outputting the control value comprises a digital-to-analogue conversion.

24. The method of claim 20, wherein filter coefficients are determined depending on the power control word, and wherein deriving the control value is via a compensation filter function with the filter coefficients.

25. The method of claim 24, further comprising determining at least one of the desired value, the compensation factor, and the filter coefficients depending on the power control word.

26. The method of claim 25, wherein determining at least one of the compensation factor and the filter coefficients comprises an interpolation of stored values.

27. The method of claim 20, wherein a correction factor is determined depending on the level value and the control value, and wherein deriving the control value comprises a multiplication by the correction factor.

28. The method of claim 27, wherein determining the correction factor comprises deriving a differential gain factor from the level value and the control value and deriving the correction factor from the differential gain factor.

29. The method of claim 28, wherein deriving the differential gain factor is effected by division of the deviation of the level value and a deviation of the control value.

30. The method of claim 29, wherein the division when deriving the differential gain factor comprises a shift operation.

31. The method of claim 28, wherein the correction factor is derived from the differential gain factor by multiplication by a scaling factor.

* * * * *

UNITED STATES PATENT AND TRADEMARK OFFICE
CERTIFICATE OF CORRECTION

PATENT NO. : 7,733,184 B2
APPLICATION NO. : 12/234387
DATED : June 8, 2010
INVENTOR(S) : Alexander Belitzer et al.

Page 1 of 1

It is certified that error appears in the above-identified patent and that said Letters Patent is hereby corrected as shown below:

On the Title Page, change

Item 75, change "Zechenstr" to -- "Bochum" --.

Add Item (30) "Foreign Priority Data

Claims priority to DE Application number 102007045309.6 Filed September 21, 2007".

Signed and Sealed this
Sixth Day of August, 2013

Teresa Stanek Rea
*Acting Director of the United States Patent and Trademark Office*